United States Patent [19]

Noble et al.

[11] 4,038,117
[45] July 26, 1977

[54] PROCESS FOR GAS POLISHING SAPPHIRE AND THE LIKE

[75] Inventors: Lowell A. Noble, Monte Sereno; Leonard N. Grossman, Aptos; Mickey O. Marlowe, Livermore, all of Calif.

[73] Assignee: ILC Technology, Inc., Sunnyvale, Calif.

[21] Appl. No.: 610,156

[22] Filed: Sept. 4, 1975

[51] Int. Cl.² .............................................. C09K 13/00
[52] U.S. Cl. ........................................ 156/646; 65/32; 252/79.1; 264/82
[58] Field of Search ................... 252/79.1, 372; 156/2, 156/17; 65/32; 423/625; 204/192 EC, 192 E; 427/255; 264/82

[56] References Cited

U.S. PATENT DOCUMENTS

| | | | |
|---|---|---|---|
| 3,026,177 | 3/1962 | Pierre et al. | 65/32 |
| 3,546,036 | 12/1970 | Manaseuit | 156/2 |
| 3,808,065 | 4/1974 | Robinson et al. | 156/2 |
| 3,855,024 | 12/1974 | Lim | 156/17 |
| 3,878,005 | 4/1975 | Warren et al. | 156/2 |

*Primary Examiner*—Charles E. Van Horn
*Assistant Examiner*—Jerome W. Massie
*Attorney, Agent, or Firm*—Phillips, Moore, Weissenberger, Lempio & Majestic

[57] ABSTRACT

A process for polishing surfaces of sapphire or similar materials to remove surface imperfections visible at magnifications of 1,000X or higher regardless of the shape of the surface, is disclosed, which process comprises the steps of heating the material to an elevated temperature and exposing the surface to be polished to a static hydrogen environment.

6 Claims, 1 Drawing Figure

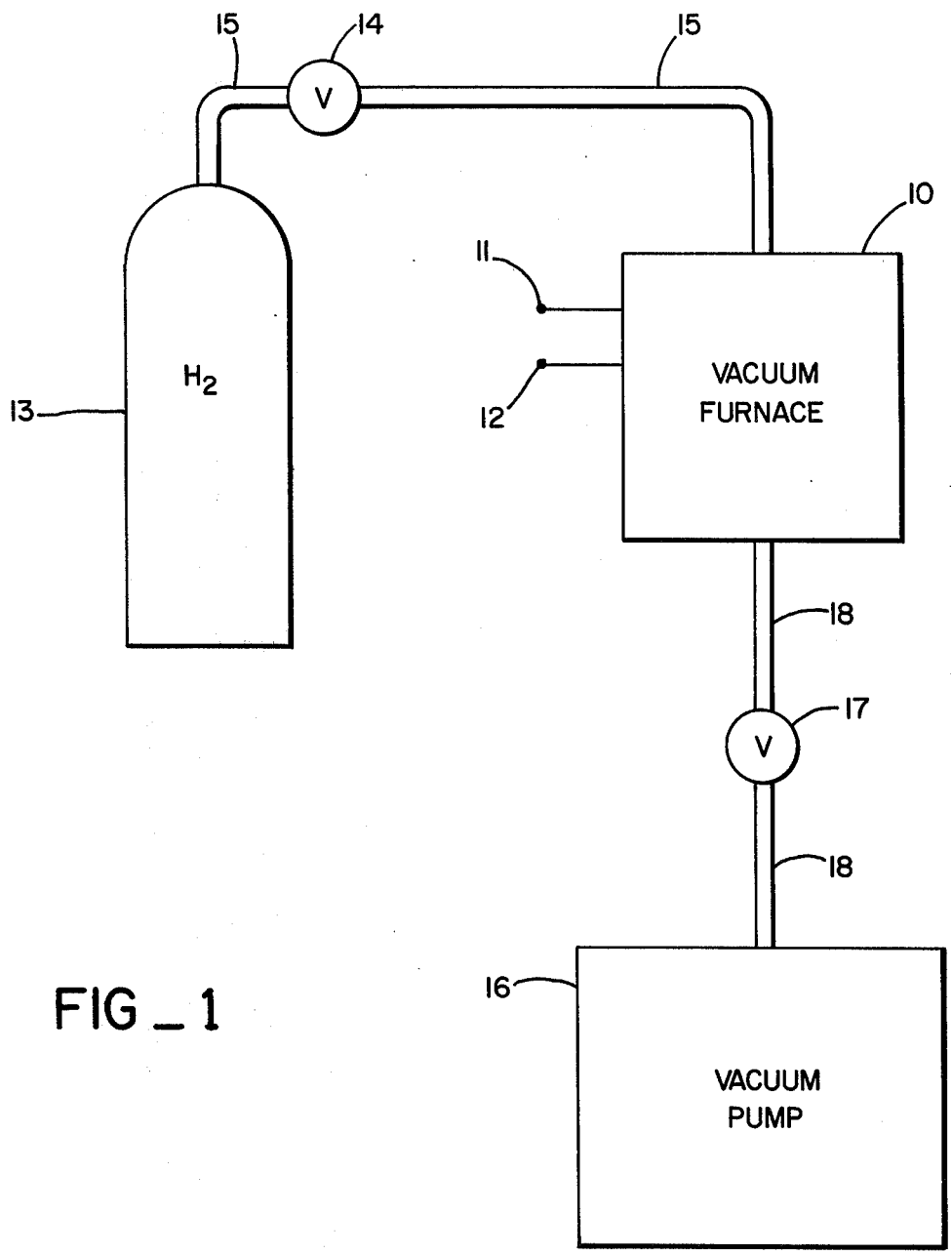
FIG_1

PROCESS FOR GAS POLISHING SAPPHIRE AND THE LIKE

BACKGROUND OF THE INVENTION

This invention relates to the polishing of surfaces of sapphire or similar materials to remove microscopic surface imperfections and particularly to a process for polishing such surfaces, regardless of their shape, by exposing such surfaces to a substantially static environment of hydrogen.

In the fabrication of a variety of optical and electronic devices, bodies of single crystal sapphire or polycrystalline alumina or the like, having at least one surface which is as smooth as possible, are required. Examples of such requirements are dielectric substrates for semiconductor devices and transparent envelopes for use in high temperature gas discharge lamps and lasers.

Where the desired surface is flat, mechanical polishing techniques have been used in the prior art. Thus, the desired size body is cut from a larger single crystal or polycrystalline body and the desired surface is subjected to a mechanical grinding operation to reduce such surface to the "ground" (opaque) state. The surface is then polished with diamond paste or a paste of silicon carbide and buffed with an alumina powder.

By careful attention to technique, surface finishes having no scratches or other surface finishes visible at magnifications of 400× may be obtained. In fact, surface finishes of one microinch can be obtained with some degree of certainty but at great expense in terms of time as well as money.

Although mechanical polishing techniques may be technically feasible for flat surfaces, the problems involved in applying such techniques to the interior surfaces of cylindrical bodies, such as lamp envelopes, for example, become prohibitive. Where the body to be polished is made of soft material or a material which is hygroscopic, the above-described mechanical polishing techniques present further problems.

Thus, in the prior art, a number of chemical polishing techniques have been developed based on the use of liquid, vapor or gaseous etchants. All of such techniques have included the steps of heating the body to an elevated temperature below the melting point thereof and then subjecting the surface to be polished to a flowing etchant in an attempt to remove the surface imperfections.

The use of liquid etchants has been found to be generally undesirable since they tend to leave residues on the surface which are difficult to remove. Furthermore, liquid etching processes are inherently non-uniform and are difficult to carry out since special equipment is required to handle the flow of liquid etchant. Finally, since the body must be placed in and removed from the liquid etching equipment, in addition to subjecting it to cleaning steps, contamination of the polished surface cannot be avoided.

The beneficial effects of firing polycrystalline bodies of alumina in hydrogen have long been known as represented by U.S. Pat. No. 3,026,177. Thus, the use of flowing hydrogen as a gaseous etchant has been tried in an attempt to avoid the disadvantages of mechanical and liquid chemical polishing techniques. However, the etch rate of hydrogen was found to be so small that this approach is generally accepted as being impractical.

Thus, according to the teaching of U.S. Pat. No. 3,243,323 a polishing technique comprising the steps of heating the body to between 700° and 850° C. and then passing an etchant comprising a mixture of hydrogen and hydrogen chloride gases over the surface to be polished was proposed. Similarly, according to the teaching of U.S. Pat. No. 3,366,520, it has been proposed to utilize a flowing stream of hydrogen iodide in a carrier gas as the etchant at temperatures of 890° to 1300° C. Another proposal taught in U.S. Pat. No. 3,392,069 is to use a flowing gaseous mixture of hydrogen, hydrogen chloride and a chloride of the body material as the etchant at a temperature between 50° and 500° C. below the melting point of the body. More recently, it has been proposed in U.S. Pat. No. 3,546,036 to use a flowing gas containing fluorides such as $SF_4$ and $SF_6$ as the etchant at temperatures between 1300° and 1600° C.

However, all of such proposals have the disadvantage that it is difficult to accurately control the etch rate over the surface of the body, particularly where the body is polycrystalline or the surface is other than a flat plane. In the first place, perfectly homogeneous mixtures of the gases are difficult, if not impossible, to obtain and maintain and in the second place a constant and homogeneous flow of gases over the surface to be polished is impossible due to the very presence of the surface defects which are to be removed even where the surface is a flat planar surface rather than some more complex shape.

It is an object of this invention to provide a surface-polishing technique for sapphire and the like which is equally effective regardless of the shape of surface to be polished.

It is a further object of this invention to provide a surface-polishing technique for sapphire and the like which does not depend on flowing fluids or mixtures of fluids.

It is another object of this invention to provide a surface-polishing technique for sapphire and the like capable of removing all surface imperfections visible at magnifications of at least 1000× in a process time of one hour or less.

It is yet another object of this invention to provide a surface-polishing technique for sapphire and the like which will not contaminate the polished surface.

Briefly, the method of surface-polishing bodies of sapphire and the like according to the teaching of this invention comprises the steps of heating said body to a temperature of about 1900° C. and exposing at least one surface of said body to substantially static hydrogen gas for about one hour while maintaining said temperature of about 1900° C.

BRIEF DESCRIPTION OF THE DRAWING

The foregoing and other objects and features of this invention will be more fully understood from a reading of the following specification in conjunction with the drawing in which FIG. 1 is an illustration of a preferred embodiment of the apparatus which may be used in practicing the process of this invention.

DESCRIPTION OF THE PREFERRED EMBODIMENT

As shown in FIG. 1 the process of this invention may be practiced by placing the sapphire body or the like to be polished in a vacuum furnace 10. In an actual embodiment of the apparatus, a vacuum furnace 10 about 8 inches in diameter and 10 inches long manufactured by the Brew manufacturing company was used. Such furnace 10 is of the type which includes tungsten resistive elements (not shown) having terminals 11, 12 connected across an appropriate electrical power source as the source of heat.

The furnace 10 is provided with an appropriate opening (not shown) which may be sealed air tight and through which sapphire bodies or the like may be placed within the furnace. An appropriate means (not shown) is of course provided for supporting the body or bodies to be processed within the furnace. According to the teaching of this invention, the orientation within the furnace of the body or bodies to be treated is unimportant so long as the surface or surfaces thereof to be polished are exposed to the interior of the furnace.

A source of hydrogen gas 13 which may be a commercially available bottle of hydrogen gas under pressure is connected to the interior of the furnace 10 through an appropriate valve 14 and conduit 15. Similarly, a vacuum pump 16 is connected to the interior of the vacuum furnace 10 through an appropriate valve 17 and conduit 18.

In practicing the process of this invention, the desired body to be processed is placed in the furnace 10 which is then sealed. The vacuum pump 16 and valve 17 are then operated to evacuate the furnace 10 through the conduit 18.

The valve 14 may be opened to supply hydrogen gas to the furnace 10 as soon as the furnace has been sealed and the pumping action begins. Alternatively, the furnace 10 may be at least partially evacuated before hydrogen gas is supplied thereto although it is believed to be more expeditious to begin supplying hydrogen gas immediately in order to "flush" all other gases from the furnace and insure that the vacuum pump will operate at its full capacity.

When the gas present within the furnace is substantially pure hydrogen gas the flow thereof is reduced to the minimum level necessary to maintain the pure hydrogen gas environment and the heating elements of the furnace 10 are energized by connection of an appropriate electrical power source across the terminals 11, 12 to raise the temperature within the furnace 10 to about 1900° C and maintain such temperature for the desired period. It will be understood that the furnace 10 includes an appropriate thermostat type control for maintaining the desired temperature. It will also be understood that other types of heat sources could be used to reach and maintain the desired temperature.

It has been found that, if the level of the flow of hydrogen gas into the furnace 10 necessary to maintain the pure hydrogen gas environment within the furnace is low enough to provide a substantially static gas environment, an unexpected polishing action occurs which is sufficient to provide a finish on all prepared and exposed surfaces of the body that has no imperfections that can be detected by a scanning electron microscope at magnifications of 1,000× in a treatment time of one hour. In fact, finishes have been achieved, in one hour of treatment according to the process of this invention as described above, having no imperfection detectable by a scanning electron microscope at magnifications of 10,000×.

It is, of course, known that the following chemical reaction occurs at elevated temperatures:

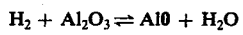

$$H_2 + Al_2O_3 \rightleftharpoons AlO + H_2O$$

The above reaction certainly provides the etching action heretofore detected by those who have attempted to use flowing hydrogen in polishing bodies of sapphire and the like. This reaction is probably also responsible for the beneficial effects of heating polycrystalline bodies of pure alumina in hydrogen gas as mentioned hereinabove.

However, applicant believes that the new and unexpected polishing action achieved by the use of a substantially static environment of hydrogen gas in accordance with the teaching of this invention is due to the fact that the above reaction is reversable and that a transportation and redeposition of $Al_2O_3$ occurs at the temperature level and under the substantially static environment conditions involved. In other words, $Al_2O_3$ removed at one point on the surface of the body is redeposited at another point on such surface and the rate of removal and redeposition tends to average out over such surface resulting in an unexpectedly rapid and efficient polishing action.

The exact parameters involved in maximizing the polishing action according to the teaching of this invention are difficult to establish. For example, it is possible that the speed of such polishing action would be influenced by the pressure of the hydrogen gas within the furnace 10. Applicant has successfully polished bodies using hydrogen gas pressures within the furnace 10 which are at or below atmospheric. There is reason to believe that if the pressure of the hydrogen gas in the furnace is very high, or very low, the desired reaction will be inhibited. Thus, it is believed that the optimum polishing action according to this invention will occur at a hydrogen gas pressure within the furnace between 1 Torr and 2000 Torr.

Similarly, it is believed that the amount of moisture ($H_2O$) present in the hydrogen gas within the furnace will influence the speed of the polishing action according to this invention. Applicant has successfully polished bodies using bottled hydrogen gas as commercially available. Such bottled gas has a dew point of about −90° C and is thus quite dry (i.e., has a very low moisture content). However, it is believed that the use of hydrogen gas having a dew point as high as 50° C would provide the polishing action according to the teaching of this invention.

The temperature utilized is a more critical parameter since at temperatures higher than 1900° C the redeposition of $Al_2O_3$ will be reduced and at lower temperatures the etching or vaporization action will be reduced. In addition, the temperature used must be kept well below the melting temperature of the body to be processed (i.e., nominally 2040° C for sapphire or the like). Applicant believes the optimum temperature for use according to his invention to be within a few degrees of 1900° C although it is also believed that the polishing action according to this invention will be achieved over a 100° C range of temperatures centered about 1900° C.

The most critical parameter of this invention is the substantially static condition of the hydrogen gas during processing. It has been established that the polishing achieved according to this invention will vary inversely with the rate of flow of the gas in contact with or immediately adjacent the surface to be polished. Thus, the flow of gases within the furnace 10 should be kept to a minimum. Applicant has successfully polished bodies regardless of their orientation and without using baffles or the like when the valves 14 and 17 of the apparatus of FIG. 1 have been adjusted to provide a flow rate of about 18 cubic inches per minute through the furnace 10 and believes that flow rates as high as 500 cubic inches per minute could be tolerated. It will be understood that even higher flow rates through the furnace 10 might be used if appropriate steps were taken to cause the gas immediately adjacent the surface to be polished to remain substantially static.

Applicant believes that preferential etching or vaporization of $Al_2O_3$ will tend to occur without compensating redeposition of $Al_2O_3$ if there is any appreciable movement of the hydrogen gas in contact with the surface to be polished. It is known that certain facts of a sapphire crystal will be etched or vaporized by flowing hydrogen gas more rapidly than other facets of the same crystal. Thus, where tubular body or a body of some other complex shape is formed from a sapphire crystal, a number of different facets of such crystal will be exposed at differing areas of the body and processing in flowing hydrogen will actually add to the roughness of the surface rather than resulting in a polishing of the surface of the body. Similarly, any surface of a polycrystalline body of alumina will present a large number of different fragmentary facets to the flowing gas enhancing the possibility of preferential etching and resultant roughening of the surface.

According to applicant's invention, the redeposition of $Al_2O_3$ from the static gas is believed to result in a redistribution of the surface material and a balancing out of the preferential etching phenomena. In any event, it has been found that extremely smooth surfaces can be produced on surfaces of bodies of sapphire in 1 hour or less of treatment according to applicant's invention.

It will, of course, be understood that the amount of polishing achieved will vary directly with the duration of treatment. It will also be understood that the duration of the treatment required to achieve a given surface finish will depend on the initial condition of the surface. However, applicant has found that one hour of treatment according to his invention is sufficient to provide a surface having no imperfections visible at magnifications of 1000× where the initial body has been produced by conventional techniques heretofore used to produce bodies intended for subsequent polishing for optical purposes.

For example, applicant has found that one hour of treatment according to his invention on tubular bodies of sapphire as received from the supplier for use as envelopes for arc lamps will produce a finish having no imperfections visible at 10,000× magnification on a scanning electron microscope. Similarly, applicant has found that sapphire discs cut by conventional means for use as substrates for silicon-on-sapphire semi conductive devices and polished solely by one hour of treatment in accordance with his invention have surface finishes equal or superior to the surface finish that can be obtained by any other means where charge carrier mobility in the finished device serves as a measure of the quality of the surface finish.

It is believed that the teaching of this invention could be extended to the polishing of other materials similar to sapphire where a similar chemical reaction can be utilized. It is also believed that those skilled in the art will make obvious modifications in the parameters of the treatment according to this invention, some of which have been suggested hereinabove, to suit such treatment for specific uses.

What is claimed is:

1. The process of surface-polishing bodies of sapphire and the like comprising the steps of heating said body to a temperature of about 1900° C and exposing at least one surface of said body to substantially static hydrogen gas while maintaining said temperature of about 1900° C for a time sufficient that no imperfections in said at least one surface can be detected when subsequently examined by a scanning electron microscope at magnifications of at least 1000×.

2. The process of claim 1 wherein said exposure of said at least one surface of said body to substantially static hydrogen gas while maintaining said temperature of about 1900° C is continued for about 1 hour.

3. The process of claim 1 wherein said hydrogen gas has a pressure between 1 Torr and 2000 Torr.

4. The process of claim 1 wherein said hydrogen gas has a dew point less than 50° C.

5. The process of claim 2 wherein said hydrogen gas has a pressure of about 400 Torr.

6. The process of claim 5 wherein said hydrogen gas has a dew point of about −80° C.

* * * * *

UNITED STATES PATENT OFFICE
CERTIFICATE OF CORRECTION

Patent No. 4,038,117      Dated July 26, 1977

Inventor(s) LOWELL A. NOBLE, LEONARD N. GROSSMAN, MICKEY O. MARLOWE

It is certified that error appears in the above-identified patent and that said Letters Patent are hereby corrected as shown below:

Column 5, line 12 - Change "facts" to --facet--.

Signed and Sealed this

Twentieth Day of February 1979

[SEAL]

Attest:

RUTH C. MASON
*Attesting Officer*

DONALD W. BANNER
*Commissioner of Patents and Trademarks*